United States Patent
Chung et al.

(10) Patent No.: US 10,444,312 B2
(45) Date of Patent: Oct. 15, 2019

(54) MAGNETIC RESONANCE IMAGING SYSTEM

(71) Applicants: GIL MEDICAL CENTER, Incheon (KR); GACHON UNIVERSITY OF INDUSTRY-ACADEMIC COOPERATION FOUNDATION, Seongnam-si, Gyeonggi-do (KR)

(72) Inventors: Jun-Young Chung, Incheon (KR); Kyoung-Nam Kim, Incheon (KR); Yuenchul Ryu, Suwon-si (KR); Yeji Han, Seoul (KR)

(73) Assignees: Gachon University of Industry-Academic Cooperation Foundation (KR); Gil Medical Center (KR)

( * ) Notice: Subject to any disclaimer, the term of this patent is extended or adjusted under 35 U.S.C. 154(b) by 269 days.

(21) Appl. No.: 15/350,202

(22) Filed: Nov. 14, 2016

(65) Prior Publication Data

US 2017/0315192 A1 Nov. 2, 2017

(30) Foreign Application Priority Data

May 2, 2016 (KR) .................. 10-2016-0054268

(51) Int. Cl.
  *G01R 33/48* (2006.01)
  *G01R 33/56* (2006.01)
  (Continued)

(52) U.S. Cl.
  CPC ..... *G01R 33/4828* (2013.01); *G01R 33/3635* (2013.01); *G01R 33/543* (2013.01);
  (Continued)

(58) Field of Classification Search
  CPC .............. G01R 33/36; G01R 33/3628; G01R 33/3635; G01R 33/385; G01R 33/48–586
  See application file for complete search history.

(56) References Cited

U.S. PATENT DOCUMENTS

| 4,871,968 A | 10/1989 | Kanayama |
| 5,208,534 A | 5/1993 | Okamoto et al. |
| (Continued) |

FOREIGN PATENT DOCUMENTS

| CN | 1950713 | 4/2007 |
| CN | 101208610 | 6/2008 |
| (Continued) |

OTHER PUBLICATIONS

Japanese Office Action, Japanese Patent Application No. 2016-219929, dated Oct. 31, 2017.
(Continued)

*Primary Examiner* — Huy Q Phan
*Assistant Examiner* — David B Frederiksen
(74) *Attorney, Agent, or Firm* — Perman & Green, LLP

(57) ABSTRACT

Disclosed is a magnetic resonance imaging (MRI) system. The disclosed MRI system includes a system controller capable of separately acquiring MR image signals of different elements existing in an object. The system controller includes a first system controller capable of acquiring an MR signal of a first element, and a second system controller capable of acquiring an MR signal of a second element different from the first element. The first system controller and the second system controller are physically separated. The first system controller and the second system controller control a first radio frequency (RF) coil element and a second RF coil element of an RF coil, respectively.

13 Claims, 6 Drawing Sheets

(51) Int. Cl.
*G01R 33/54* (2006.01)
*G01R 33/36* (2006.01)
*G01R 33/34* (2006.01)
*G01R 33/385* (2006.01)

(52) U.S. Cl.
CPC .... *G01R 33/5608* (2013.01); *G01R 33/34046* (2013.01); *G01R 33/385* (2013.01)

(56) References Cited

U.S. PATENT DOCUMENTS

| | | | | |
|---|---|---|---|---|
| 5,277,182 | A * | 1/1994 | Koizumi | G01R 33/563 |
| | | | | 600/413 |
| 5,287,854 | A | 2/1994 | Leunbach | |
| 5,293,126 | A | 3/1994 | Schaefer | |
| 5,497,089 | A | 3/1996 | Lampman et al. | |
| 6,163,152 | A * | 12/2000 | Bernstein | G01R 33/56518 |
| | | | | 324/306 |
| 6,650,118 | B2 * | 11/2003 | Leussler | G01R 33/3415 |
| | | | | 324/318 |
| 7,420,369 | B2 | 9/2008 | Van Den Brink et al. | |
| 8,035,384 | B2 | 10/2011 | Saha | |
| 8,334,692 | B2 | 12/2012 | Harvey et al. | |
| 8,731,635 | B2 | 5/2014 | He | |
| 8,933,697 | B2 | 1/2015 | Chen et al. | |
| 9,274,194 | B2 * | 3/2016 | Hwang | G01R 33/4828 |
| 2010/0253333 | A1 | 10/2010 | Zhai et al. | |
| 2010/0315084 | A1 * | 12/2010 | Sacolick | A61B 5/055 |
| | | | | 324/309 |
| 2011/0015078 | A1 | 1/2011 | Gao et al. | |
| 2012/0150019 | A1 * | 6/2012 | Elgort | G01N 24/08 |
| | | | | 600/411 |
| 2012/0308111 | A1 * | 12/2012 | Stehning | G01R 33/3415 |
| | | | | 382/131 |
| 2013/0033262 | A1 * | 2/2013 | Porter | A61B 5/055 |
| | | | | 324/309 |
| 2013/0043868 | A1 * | 2/2013 | Hwang | G01R 33/4816 |
| | | | | 324/309 |
| 2014/0070805 | A1 * | 3/2014 | Van Der Meulen | |
| | | | | G01R 33/246 |
| | | | | 324/309 |
| 2014/0210465 | A1 | 7/2014 | Kim et al. | |
| 2015/0253403 | A1 * | 9/2015 | Grissom | G01R 33/4831 |
| | | | | 324/309 |
| 2015/0355302 | A1 | 12/2015 | Fischer et al. | |
| 2016/0274205 | A1 * | 9/2016 | Stemmer | G01R 33/543 |
| 2016/0299208 | A1 * | 10/2016 | Shigeta | G01R 33/56554 |
| 2016/0356870 | A1 * | 12/2016 | Sun | G01R 33/5605 |
| 2017/0160354 | A1 | 6/2017 | Kim et al. | |
| 2017/0285118 | A1 * | 10/2017 | Kim | A61B 5/055 |

FOREIGN PATENT DOCUMENTS

| | | |
|---|---|---|
| CN | 101726714 | 6/2010 |
| JP | 64052443 | 2/1989 |
| JP | 03068342 | 3/1991 |
| JP | 2902107 | 11/1992 |
| JP | 08000594 | 1/1996 |
| JP | 2008067733 | 3/2008 |
| JP | 2008543483 | 12/2008 |
| JP | 2011505956 | 10/2010 |
| JP | 2011235183 | 11/2011 |
| KR | 20120070536 | 6/2013 |
| KR | 20140096917 | 8/2014 |
| KR | 20150139796 | 12/2015 |
| KR | 20160002548 | 1/2016 |
| WO | 2011101767 | 8/2011 |

OTHER PUBLICATIONS

European Search Report, European Application No. 16198102, dated Jun. 8, 2017.

* cited by examiner

MAGNETIC RESONANCE IMAGING SYSTEM

CROSS-REFERENCE TO RELATED APPLICATION

This application claims the benefit of Korean Patent Application No. 10-2016-0054268, filed on May 2, 2016, in the Korean Intellectual Property Office, the disclosure of which is incorporated herein in its entirety by reference.

BACKGROUND

1. Field

The present disclosure relates to a magnetic resonance imaging (MRI) system including a plurality of system controllers.

2. Description of the Related Art

A variety of diagnosis apparatuses for diagnosing an abnormality in a human body are used to prevent or cure disease. Among the diagnosis apparatuses, an MRI apparatus that uses a magnetic field generated by magnetism is widely being used.

The MRI apparatus captures a cross-sectional view of an object, for example, a human body, by using nuclear magnetic resonance. Since various kinds of nuclei existing in a human body have their unique rotating magnetic field constants due to nuclear magnetic resonance, it is possible to acquire an image of the human body by applying electromagnetic waves to magnetization vectors of the nuclei and receiving magnetic resonance (MR) signals generated by the magnetization vectors lying on a vertical plane due to resonance.

At this time, a radio frequency (RF) coil is used to apply the electromagnetic waves to the human body so as to resonate magnetization vectors in the human body and also used to receive the MR signals generated by the magnetization vectors lying on the vertical plane due to the resonance. The RF coil is also referred to as an RF antenna because the RF coil transmits electromagnetic waves to resonate magnetization vectors and receives MR signals. It is possible to resonate magnetization vectors (a transmission mode) and also receive MR signals (a reception mode) by using one RF coil, or it is possible to perform the transmission mode and the reception mode by separately using two RF coils, that is, an RF coil for the transmission mode and an RF coil for the reception mode. While the single coil that performs both the transmission and reception modes is referred to as a transceiver coil, the coil for transmission is referred to as a transmission coil, and the coil for reception is referred to as a reception coil.

To obtain an MR image of an object, a general MRI system performs an operation of transitioning various elements, for example, nuclei of hydrogen, sodium, phosphorus, etc., existing in the object from a low-energy state to a high-energy state and acquiring MR signals of the elements.

SUMMARY

Provided is a magnetic resonance imaging (MRI) system capable of photographing multiple nuclides for a magnetic resonance (MR) image. A technical problem to be solved by the present embodiment is not limited thereto, and other technical problems may exist.

Additional aspects will be set forth in part in the description which follows and, in part, will be apparent from the description, or may be learned by practice of the presented exemplary embodiments.

According to an aspect of an exemplary embodiment, an MRI system includes: a main magnet, a gradient coil, and a radio frequency (RF) coil formed in a housing; and a system controller configured to control the main magnet, the gradient coil, and the RF coil, wherein the system controller includes different system controllers capable of simultaneously or sequentially acquiring MR images of different elements.

According to an aspect of another exemplary embodiment, an operating method of an MRI system includes: determining target elements for MR images of an object to be acquired; determining whether to capture MR images of the determined target elements simultaneously or sequentially; and acquiring MR images of the target elements of the object by operating a system controller of the MRI system.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Hereinafter, a magnetic resonance imaging (MRI) system according to an embodiment of the present disclosure will be described in detail. The following descriptions and the accompanying drawings are intended to understand operations according to the present embodiment, and parts that those of ordinary skill in the art may readily implement may be omitted.

The present specification and the drawings are not provided to limit the present embodiment, and the scope of the present embodiment should be determined by the claims. However, this is not to limit the present embodiment to a particular disclosed form, and should be construed as including all alterations, equivalents, and modifications within the technical spirit and scope of the present embodiment.

Figure 1:
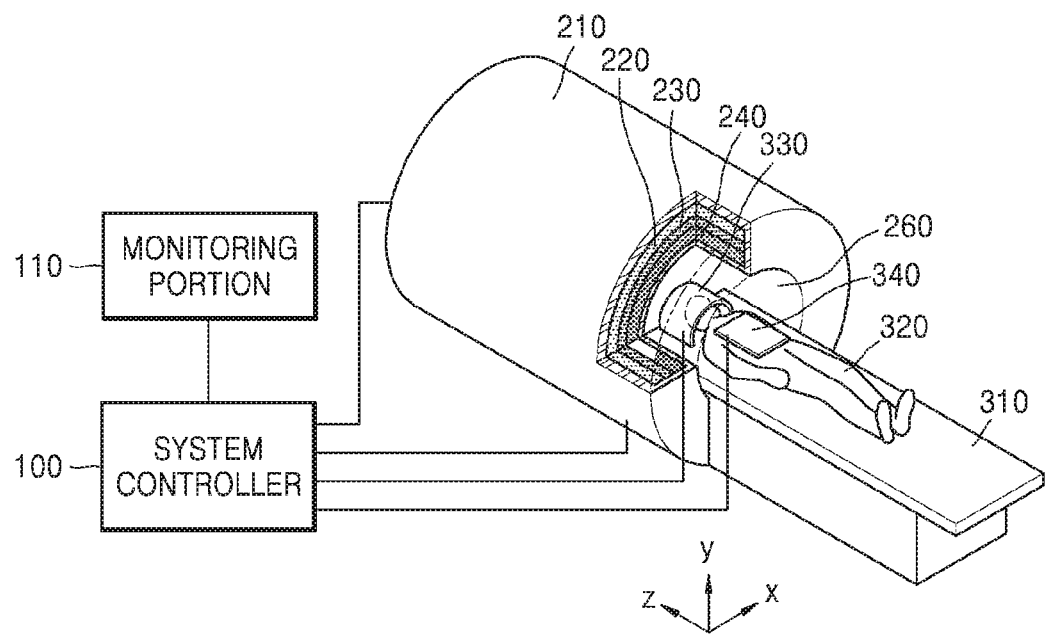
FIG. 1 is a diagram schematically showing a magnetic resonance imaging (MRI) system according to an embodiment of the present disclosure.

FIG. 1 is a diagram schematically showing an MRI system according to an embodiment of the present disclosure.

Referring to FIG. 1, an MRI system according to an embodiment of the present disclosure may include a main magnet 220 formed in a housing 210, a gradient coil 230, and a body-type radio frequency (RF) coil 240.

The main magnet 220 may generate a static magnetic field for arranging, in a direction, magnetic dipole moments of nuclei of elements, for example, hydrogen ($^1$H), phosphorous ($^{31}$P), sodium ($^{23}$Na), carbon isotopes ($^{13}$C), etc., that cause magnetic resonance among elements distributed in an object 320. For example, a superconducting magnet may be used as the main magnet 220. The stronger and more uniform a magnetic field generated by the main magnet 220, the more precise and accurate magnetic resonance (MR) image of the object 320 may be obtained.

The object 320, which is a target for capturing an MR image, may be stably mounted on a table 310 and conveyed into a bore 260 of the housing 210. The object 320 may include a human, an animal, or a part of a human or an animal. For example, the object 320 may include an internal organ, such as a liver, a heart, a uterus, a brain, a breast, an abdomen, etc., or a blood vessel.

The gradient coil 230 may be formed inside the main magnet 220. The gradient coil 230 may include three gradient coils capable of generating gradient magnetic fields in x-axis, y-axis, and z-axis directions perpendicular to each other. The gradient coil 230 may generate a gradient magnetic field that is spatially linear to capture an MR image. The gradient coil 230 may induce different resonance frequencies according to parts of the object 320 and provide position information of each part of the object 320.

The RF coil 240 may be formed inside the gradient coil 230. The main magnet 220, the gradient coil 230, and the RF coil 240 are within the housing 210 and may constitute a magnetic structure. Also, additional RF coils 330 and 340 may be formed adjacent to the object 320 stably mounted on the table 310. The RF coils 240, 330, and 340 may include the body-type RF coil 240 formed to cover the inside of the gradient coil 230 and surround the bore 260, the volume-type RF coil 330 formed to adhere closely to a part of the object 320, and the surface RF coil 340.

The RF coils 240, 330, and 340 are devices capable of generating high-frequency magnetic fields using a Larmor frequency as a center frequency, and may excite an RF signal to the object 320 and receive an MR signal emitted from the object 320. The RF coils 240, 330, and 340 may generate an electromagnetic signal, for example, an RF signal, having an RF corresponding to a kind of nuclei and apply the electromagnetic signal to the object 320 to transition the nuclei from a low-energy state to a high-energy state. When the electromagnetic signal generated by the RF coils 240, 330, and 340 is applied to the nuclei, the nuclei may transition from the low-energy state to the high-energy state. When the electromagnetic waves generated by the RF coils 240, 330, and 340 disappear, the nuclei to which the electromagnetic waves have been applied may emit electromagnetic waves having the Larmor frequency while transitioning from the high-energy state to the low-energy state. In other words, when application of the electromagnetic signal to the nuclei is stopped, the electromagnetic waves having the Larmor frequency may be emitted while an energy level of the nuclei to which the electromagnetic waves have been applied changes from high energy to low energy. The RF coils 240, 330, and 340 may receive the electromagnetic signal emitted from the nuclei in the object 320. When the received electromagnetic signal is amplified by a high-frequency amplifier and then demodulated with a sign wave of the Larmor frequency, an MR signal in a base band may be obtained. The MR signal in the base band may be subjected to image processing, and thus an MR image may be generated.

The body-type RF coil 240 may be fixed inside the gradient coil 230 of the housing 210, and the volume-type RF coil 330 and the surface RF coil 340 may be attached to or detached from the table 310 on which the object 320 is stably mounted. The volume-type RF coil 330 may be used to diagnose a particular part of the object 320, for example, a head, a face, a leg, an ankle, etc. of the object 320, or an object of a relatively small size.

The housing 210 including the main magnet 220, the gradient coil 230, and the body-type RF coil 240 may have a cylindrical shape. To capture an MR image, the object 320 may be stably mounted on the table 310 and conveyed into the bore 260 of the housing 210. The bore 260 may be formed to extend into the body-type RF coil 240 in the z-axis direction, and a diameter of the bore 260 may be determined according to sizes of the main magnet 220, the gradient coil 230, and the body-type RF coil 240.

A display may be installed on an outer side of the housing 210 of the MRI system, and an additional display may be further included on an inner side of the housing 210. Information may be delivered to a user or the object 320 through the displays positioned on the inner side and/or the outer side of the housing 210.

The MRI system may include a system controller 100 and a monitoring portion 110.

Figure 2A:
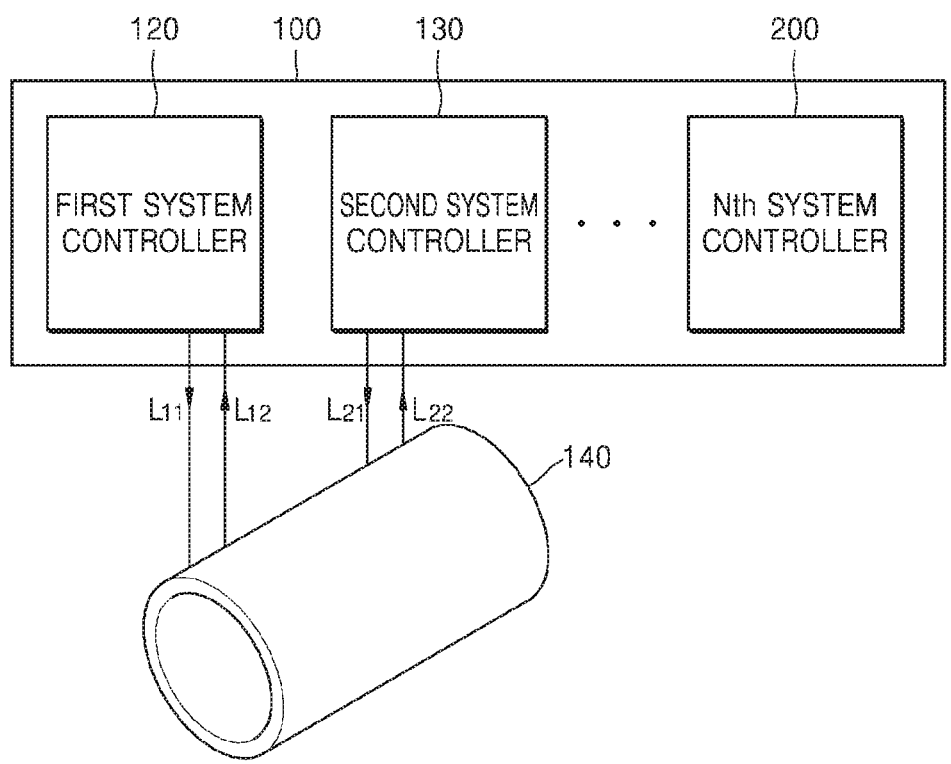
FIG. 2A is a diagram showing a system controller and a radio frequency (RF) coil of an MRI system according to an embodiment of the present disclosure.

FIG. 2A is a diagram showing a system controller and a RF coil of an MRI system according to an embodiment of the present disclosure.

Referring to FIG. 1 and FIG. 2A, the system controller 100 of the MRI system according to an embodiment of the present disclosure may have two or more system controllers 120 and 130. The first system controller 120 may acquire an MR signal of a first element, and a second system controller 130 may acquire an MR signal of a second element different from the first element.

To obtain MR images of various elements, a general MRI system performs an operation of sequentially obtaining MR signals of the respective elements. For example, an MR signal of nuclei of hydrogen ($^1$H) among elements distributed in the object 320 is acquired, and then an MR signal of nuclei of another element, for example, phosphorous ($^{31}$P), sodium ($^{23}$Na), or carbon isotopes ($^{13}$C), is acquired. However, the MRI system according to an embodiment of the present disclosure may simultaneously perform operations of acquiring MR signals of, for example, hydrogen ($^1$H), phosphorous ($^{31}$P), sodium ($^{23}$Na), and carbon isotopes ($^{13}$C) distributed in the object 320. To this end, the number of system controllers included in the system controller 100 of the MRI system according to an embodiment of the present disclosure may be varied according to kinds of elements to be measured. For example, the first system controller 120 may be intended to acquire an MR image signal of hydrogen ($^1$H) that is a first element, and the second system controller 130 may be intended to acquire an MR image signal of sodium ($^{23}$Na) that is a second element.

The first system controller 120 and the second system controller 130 may include signal transmission lines L11, L12, L21, and L22 each of which transmits a signal to an RF coil 140. With regard to the RF coil 140, the lines L11 and L12 may be reception lines, and the lines L21 and L22 may be transmission lines.

If necessary, in addition to the first system controller 120 and the second system controller 130, the MRI system according to an embodiment of the present disclosure may further include an $n^{th}$ (n is an integer equal to or greater than 3) system controller 200. For example, a third system controller, a fourth system controller, etc. capable of acquiring MR images of elements different from the first and second elements may be further included. When the third system controller, the fourth system controller, etc. are added, the third system controller and the fourth system controller may be added in the form of systems physically separated from each other like the first system controller 120 and the second system controller 130.

Figure 2B:
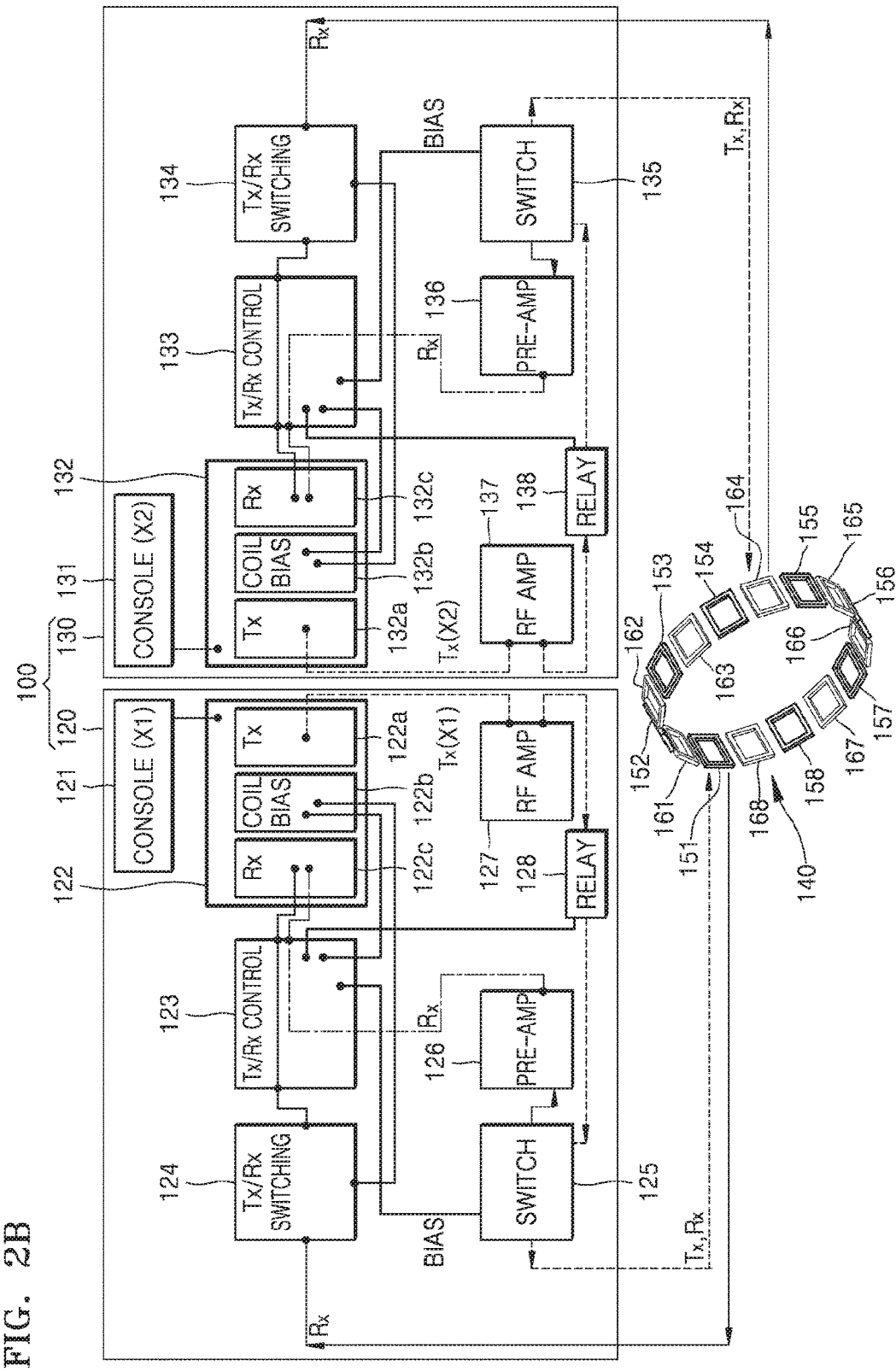
FIG. 2B is a diagram showing a system controller of an MRI system according to an embodiment of the present disclosure in detail.

FIG. 2B is a diagram showing a system controller of an MRI system according to an embodiment of the present disclosure in detail. The system controller 100 including the first system controller 120 and the second system controller 130 according to an embodiment will be described.

Referring to FIG. 2B, the first system controller 120 and the second system controller 130 of the MRI system are shown to have identical configurations. However, system controllers are not limited to the first system controller 120 and the second system controller 130, and a varied number of system controllers may be employed according to kinds of elements to be measured.

When a console 121 of the first system controller 120 generates an imaging parameter of a target element or nuclide for capturing an MR image, such a signal is transferred to the RF coil 140. Therefore, image information of a particular element in the object is received, and an MR image is generated.

This will be described in further detail. The console 121 may be connected to a spectrometer 122. The spectrometer 122 may include a transmission (Tx) board 122a, a coil bias 122b, and a receiving (Rx) board 122c. The imaging parameter generated by the console 121 is transferred from the Tx board 122a via an RF amplifier 127 and a mechanical relay 128, passes through a switch 125, and then is transferred to the RF coil 140. According to the imaging parameter generated by the console 121, a magnetic field is formed around the RF coil 140. By forming a magnetic field around the RF coil 140, it is possible to generate an MR image signal of the particular element of the object positioned in the RF coil 140. The generated MR image signal passes through a Tx/Rx (TR) switching 124 and a Tx/Rx control board 123 and then is input to the Rx board 122c. Here, the coil bias 122b serves to operate the RF coil 140 when a Tx signal is applied thereto.

The second system controller 130 operates at the same time as the first system controller 120 operates. An operation of the second system controller 130 is similar to an operation of the first system controller 120. When a console 131 of the second system controller 130 generates an imaging parameter, such a signal is transferred to the RF coil 140. Therefore, image information of a particular element in the object is received, and an MR image is generated. FIG. 2B shows that the console 121 of the first system controller 120 and the console 131 of the second system controller 130 are configured separately from each otehr, but the consoles 121 and 131 may operate as one console. In other words, a user may control the console 121 of the first system controller 120 and the console 131 of the second system controller 130 by using a substantially single computer device. The console 131 of the second system controller 130 may be connected to a spectrometer 132. The spectrometer 132 may include a Tx board 132a, a coil bias 132b, and an Rx board 132c. The imaging parameter generated by the console 131 is transmitted from the Tx board 132a via an RF amplifier 137 and a mechanical relay 138, passes through a switch 135, and then is transferred to the RF coil 140. According to the imaging parameter generated by the console 131, a magnetic field is formed in the RF coil 140. By forming a magnetic field in the RF coil 140, it is possible to generate an MR image signal of the particular element of the object positioned in the RF coil 140. The generated MR image signal passes through a TR switching 134 and a Tx/Rx control board 133 and then is input to the Rx board 132c.

The first system controller 120 and the second system controller 130 may be individually connected to the RF coil 140. The RF coil 140 shown in FIG. 2B may be the body-type RF coil 140. The first system controller 120 may be connected to first RF coil elements 151 to 158 which are some of RF coil elements in the body-type RF coil 140 and obtain an MR image signal of the particular element by exchanging signals with the first RF coil elements 151 to 158. Also, the second system controller 130 may be connected to second RF coil elements 161 to 168 which are different from the first RF coil elements 151 to 158.

A general MRI system is set to acquire an anatomical or morphological MR image of a particular element, for example, hydrogen ($^{1}$H), of the object 320. When it is attempted to acquire an MR image of an element other than hydrogen ($^{1}$H), the system setting is changed to be used. Therefore, when it is attempted to acquire MR images of different elements, the changed settings of the general MRI system are sequentially operated. For example, the general MRI system may acquire an MR image of hydrogen ($^{1}$H), and then perform an operation for acquiring an MR image of another element.

The MRI system according to an embodiment of the present disclosure may sequentially acquire MR images of different elements at some intervals. Also, since two or more separate system controllers capable of independently operating are formed, the system controllers 120 and 130 may simultaneously acquire MR image information of different elements. For example, the first system controller 120 may acquire an MR image of hydrogen ($^{1}$H) that is element X1, and the second system controller 130 may acquire an MR image of an element other than hydrogen ($^{1}$H), for example, one (X) of phosphorous ($^{31}$P), sodium ($^{23}$Na), and carbon isotopes ($^{13}$C), that is element X2. In other words, the MRI system according to an embodiment of the present disclosure may acquire MR images of different elements sequentially or simultaneously. Also, one system controller may simultaneously acquire MR images of different elements or nuclides. This may be selected by a user at will.

Figure 3:
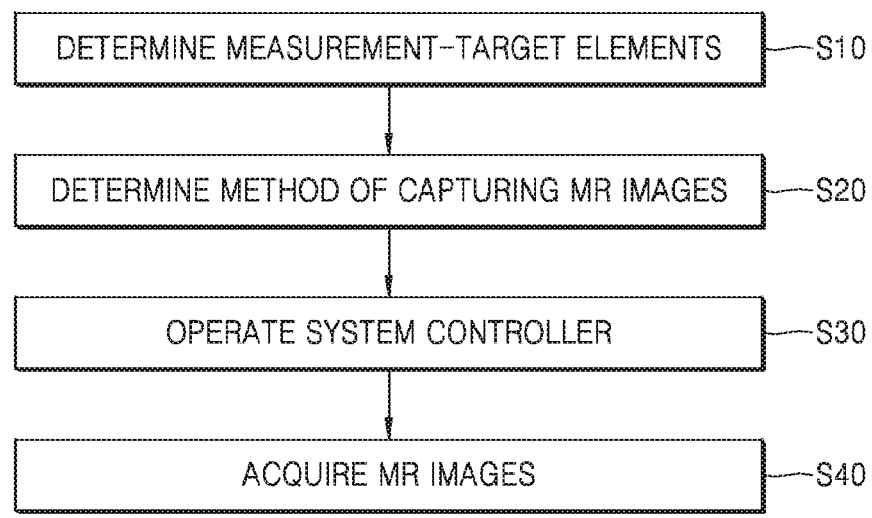
FIG. 3 is a flowchart illustrating an operating method of an MRI system according to an embodiment of the present disclosure.

FIG. 3 is a flowchart illustrating an operating method of an MRI system according to an embodiment of the present disclosure.

Referring to FIG. 3, when it is attempted to acquire an MR image of an object by using the MRI system according to an embodiment of the present disclosure, target nuclides, that is, elements, for capturing MR images to be acquired are determined first (S10). Kinds of the elements may be hydrogen ($^{1}$H), phosphorous ($^{31}$P), sodium ($^{23}$Na), carbon isotopes ($^{13}$C), and other elements. When the target nuclides, that is, elements, for MR images to be acquired are determined, it is determined whether to acquire MR images simultaneously or sequentially, that is, a method of capturing MR images is determined (S20). Then, the system controller 100 of the MRI system according to an embodiment of the present disclosure is operated according to the determined capturing method (S30). By operating the system controller 100, it is possible to acquire MR images of the target elements of measurement in the object (S40), When it is attempted to sequentially acquire MR images of different elements at some intervals, the sequential acquisition may be performed by using one of the first system controller 120 and the second system controller 130. On the other hand, when it is attempted to simultaneously acquire MR images of two or more different elements, MR images may be acquired by using system controllers corresponding to the number of elements to be measured. For example, when hydrogen ($^1$H) and phosphorous ($^{31}$P) are determined as measurement-target elements (S10) and it is attempted to simultaneously acquire MR images of hydrogen ($^1$H) and phosphorous ($^{31}$P), the first system controller 120 may set element X1 to hydrogen ($^1$H), and the second system controller 130 may set element X2 to phosphorous ($^{31}$P) (S20). Then, by simultaneously operating the first system controller 120 and the second system controller 130 (S30), it is possible to simultaneously acquire MR images of hydrogen ($^1$H) and phosphorous ($^{31}$P) in an object (S40). On the other hand, an example of a case in which it is attempted to simultaneously acquire MR images of two or more different elements or nuclides by using one system controller is as follows, First, for example, hydrogen ($^1$H) and phosphorous ($^{31}$P) are determined as measurement-target elements (S10). It is determined to capture MR images of hydrogen ($^1$H) and phosphorous ($^{31}$P) by using the first system controller 120 (S20), and the first system controller 120 is operated (S30), It is possible to adjust transmission intervals, etc. of signals corresponding to the measurement-target elements, that is, hydrogen ($^1$H) and phosphorous ($^{31}$P), through the Tx board 122a of the spectrometer 122 of the first system controller 120. As a result, it is possible to simultaneously acquire MR images of hydrogen ($^1$H) and phosphorous ($^{31}$P) in an object (S40).

Figure 4:
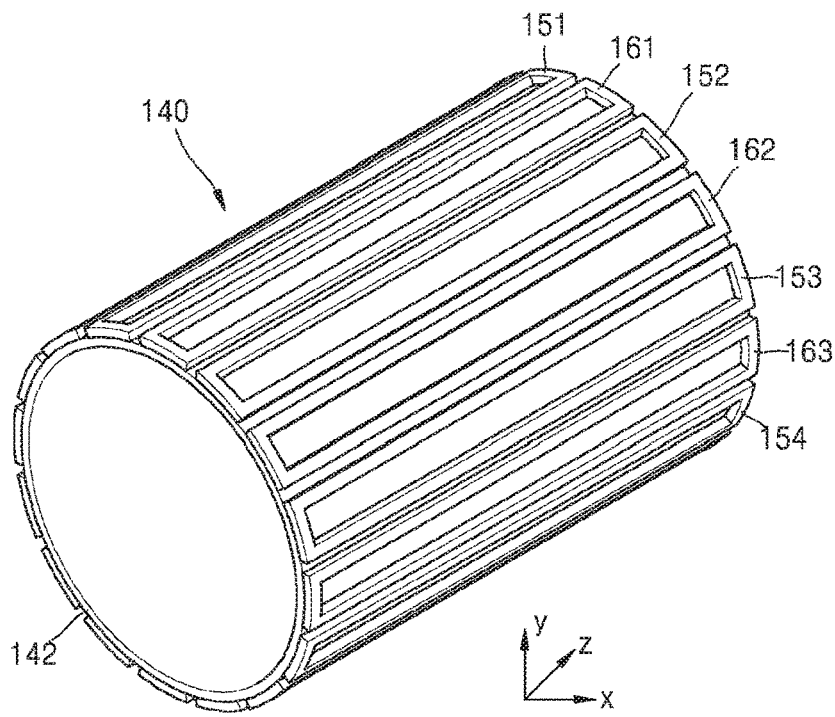
FIG. 4 is a diagram showing an example of an RF coil of an MRI system according to an embodiment of the present disclosure.

FIG. 4 is a diagram showing an example of an RF coil of an MRI system according to an embodiment of the present disclosure.

Referring to FIG. 2B and FIG. 4, the RF coil 140 may be formed into a structure including the plurality of RF coil elements 151, 152, 153, 154, 161, 162, 163, and 164 formed on a base 142, The RF coil elements 151, 152, 153, 154, 161, 162, 163, and 164 may be formed in various shapes, and FIG. 4 shows the RF coil elements 151, 152, 153, 154, 161, 162, 163, and 164 having a rectangular loop shape. The shape of the RF coil elements 151, 152, 153, 154, 161, 162, 163, and 164 is not limited thereto, and may be any of a circular loop, an oval loop, a linear beam, and so on.

The base 142 has a cylindrical shape whose ends are in a circular shape or an oval shape, and may be formed of a non-magnetic material having high corrosion resistance and formability, for example, an insulating polymer material. The RF coil elements 151, 152, 153, 154, 161, 162, 163, and 164 may be formed of an electrically conductive material. For example, the RF coil elements 151, 152, 153, 154, 161, 162, 163, and 164 may be obtained by patterning a metal having a high electrical conductivity, such as copper, silver, gold-coated copper, etc., on the base 142, but are not limited thereto.

Figure 5:
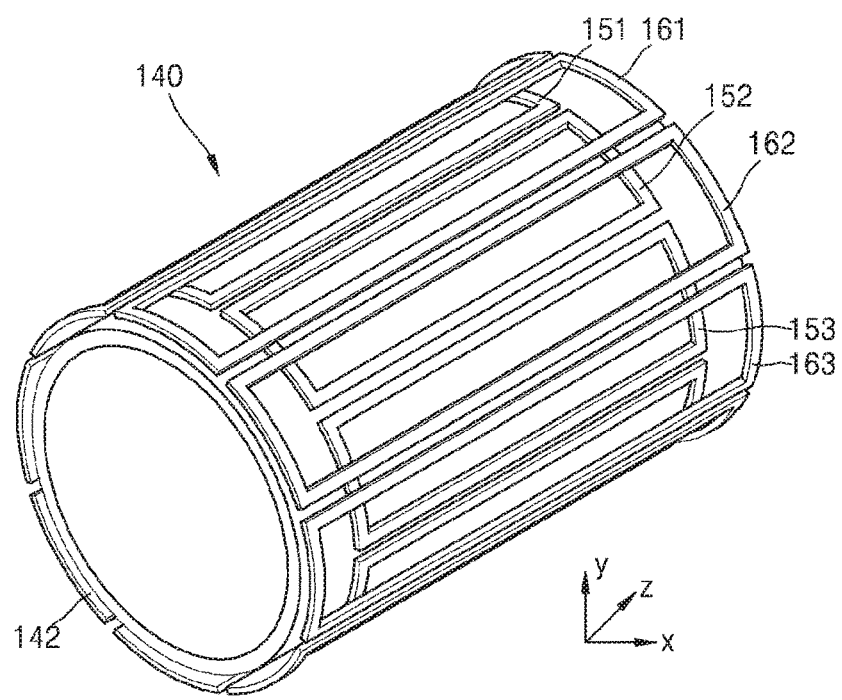
FIG. 5 is a diagram showing another example of an RF coil of an MRI system according to an embodiment of the present disclosure.

FIG. 5 is a diagram showing another example of an RF coil of an MRI system according to an embodiment of the present disclosure.

Referring to FIGS. 2B, 4, and 5, RF coil elements of the body-type RF coil 140 may be arranged side by side as shown in FIG. 4 or may partially overlap each other as shown in FIG. 5. The first RF coil elements 151 to 153 controlled by the first system controller 120 and the second RF coil elements 161 to 163 controlled by the second system controller 130 partially overlap each other but have different resonance frequencies. Therefore, even when the first RF coil elements 151 to 153 and the second RF coil elements 161 to 163 are operated to simultaneously acquire MR images of two or more elements, the first RF coil elements 151 to 153 and the second RF coil elements 161 to 163 may operate without coupling between MR image signals. A resonance frequency of an RF coil of an MRI system varies according to an operating frequency of the MRI system. For example, the first system controller 120 may operate at about 7 teslas (T) and have an operating frequency of about 300 MHz, and the second system controller 130 may operate at about 3 T and at an operating frequency of about 127.74 MHz. An RF shield material layer may be formed between RF coil elements.

Figure 6:
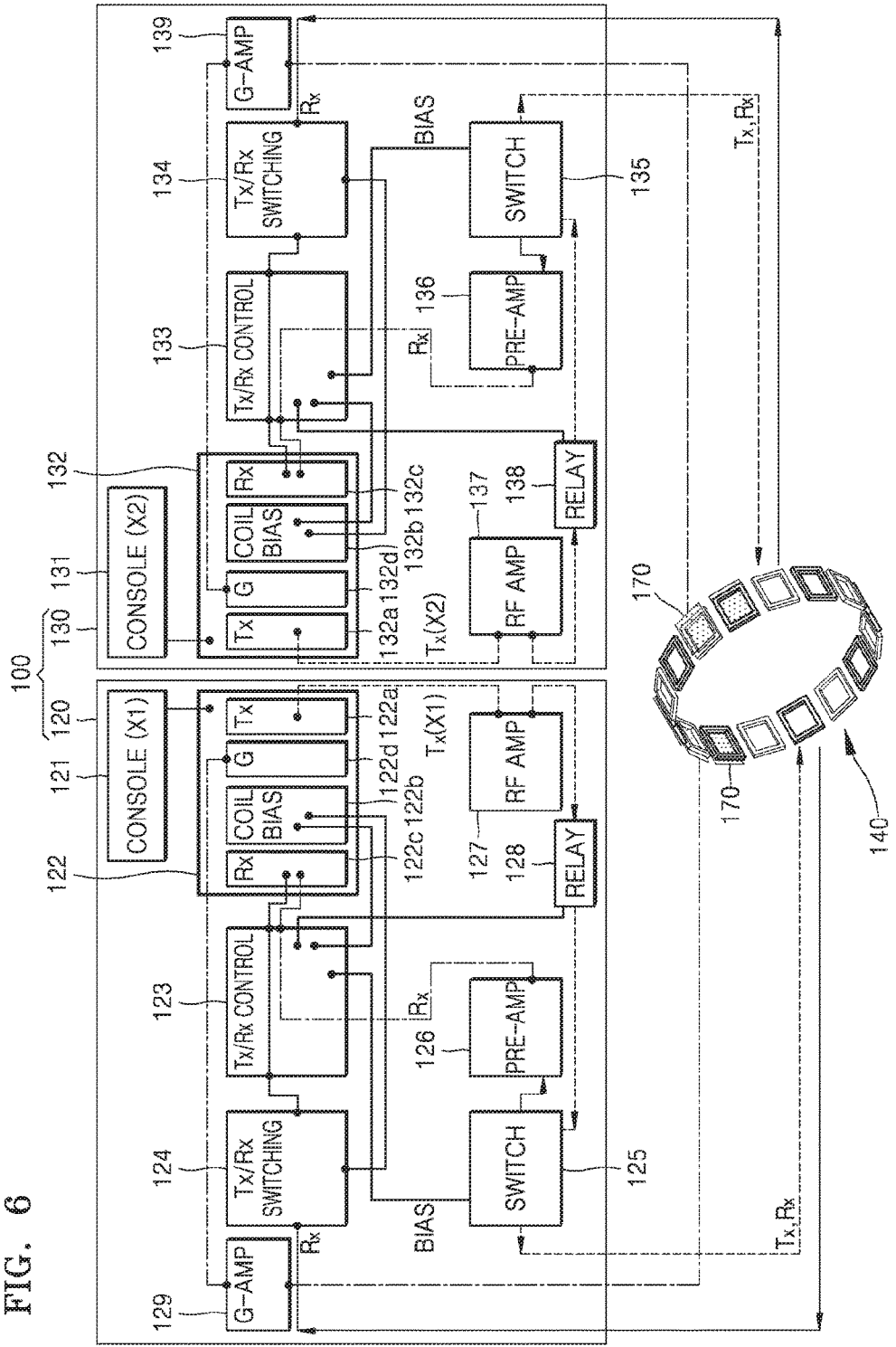
FIG. 6 is a diagram showing a surface gradient (G)-coil included in an MRI system according to an embodiment of the present disclosure.

FIG. 6 is a diagram showing a surface gradient (G)-coil of an MRI system according to an embodiment of the present disclosure.

Referring to FIG. 6, surface G-coils 170 individually connected to the first system controller 120 and the second system controller 130 may be further included. The first system controller 120 may include a gradient coil board 122d in the spectrometer 122 for controlling the surface G-coils 170 and further include a gradient amplifier 129. The second system controller 130 may include a gradient coil board 132d in the spectrometer 132 for controlling the surface C-coils 170 and further include a gradient amplifier 139. When the first system controller 120 attempts to obtain an MR image of element X1, the surface G-coils 170 may include three gradient coils capable of generating gradient magnetic fields in x-axis, y-axis, and z-axis directions perpendicular to each other. Also, when the second system controller 130 attempts to obtain an MR image of element X2, three axes may be necessary, and three gradient coils may be included therein such that gradient magnetic field may be generated in x'-axis, y-axis, and z'-axis directions. To this end, the surface G-coils 170 formed by patterning a conductive material on a cylindrical insulating former may be positioned outside the RF coil 140.

Figure 7:
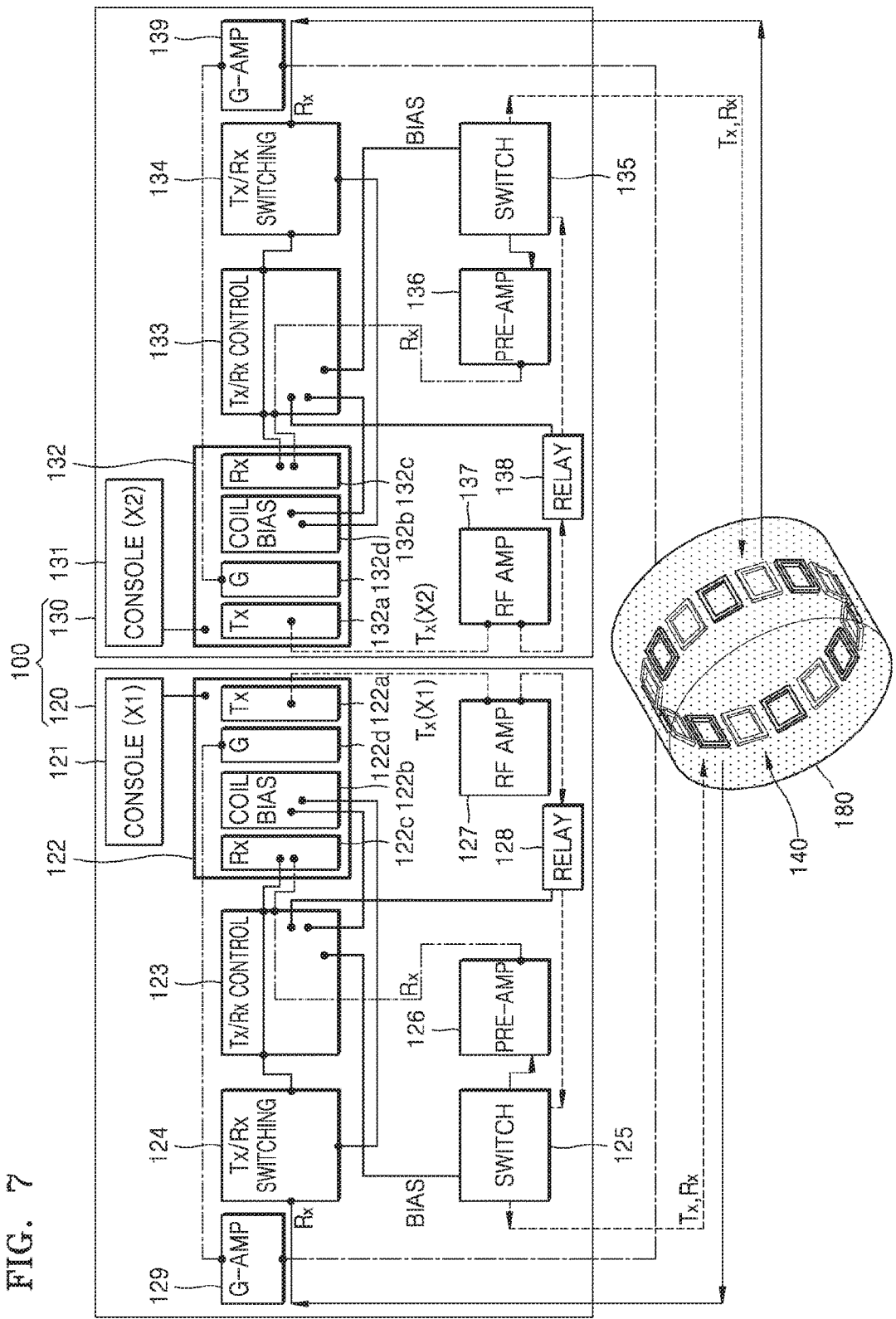
FIG. 7 is a diagram showing a cylindrical gradient coil included in an MRI system according to an embodiment of the present disclosure.

FIG. 7 is a diagram showing a cylindrical gradient coil of an MRI system according to an embodiment of the present disclosure.

Referring to FIG. 7, a cylindrical gradient coil 180 connected to the first system controller 120 and the second system controller 130 may be further included. While FIG. 6 shows that the first system controller 120 and the second system controller 130 have different surface G-coils 170. FIG. 7 shows that the first system controller 120 and the second system controller 130 are operated by using the same cylindrical gradient coil 180. The cylindrical gradient coil 180 may have, for example, a structure in which a conductive material is formed in a cylindrical birdcage or net. The overall cylindrical gradient coil 180 may operate as one resonator.

As described above, according to an embodiment, it is possible to provide an MRI system including a plurality of system controllers capable of simultaneously or sequentially acquiring MR signals of a variety of elements existing in an object.

MR signals of a plurality of elements in an object are separately and simultaneously acquired by using system controllers which are physically separated, and thus a diagnosis time for the object may be reduced. Therefore, it is possible to prevent a problem that may occur when an object is diagnosed for a long time. Also, it is possible to increase the diversity of diagnoses as much as possible through acquisition of MR images and signals of a plurality of elements.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A magnetic resonance imaging (MRI) system comprising:
    a main magnet, a gradient coil, and a radio frequency (RF) coil formed in a housing; and
    a system controller configured to control the main magnet, the gradient coil, and the RF coil,
    wherein the system controller includes different system controllers simultaneously or sequentially acquiring magnetic resonance (MR) images of different elements,
    wherein the system controller comprises:
        a first system controller configured to acquire an MR signal of a first element; and
        a second system controller configured to acquire an MR signal of a second element different from the first element,
    wherein the second system controller is different from the first system controller,
    wherein the MRI system further comprises a first surface gradient (G)-coil and a second surface gradient (G)-coil, respectively, connected to the first system controller and the second system controller,
    wherein each of the first and the second surface gradient G-coils generates gradient magnetic fields in x-axis, y-axis, and z-axis directions perpendicular to each other,
    wherein the first system controller is configured to control the first surface gradient (G)-coil to generate a first gradient magnetic field for capturing a first MR image of a first element, and
    wherein the second system controller is configured to control the second surface gradient (G)-coil to generate a second gradient magnetic field for capturing a second MR image of a second element.

2. The MRI system of claim 1, wherein operating frequencies of the first system controller and the second system controller differ from each other.

3. The MRI system of claim 1, wherein the first system controller controls a first RF coil element of the RF coil, and the second system controller controls a second RF coil element different from the first RF coil element of the RF coil.

4. The MRI system of claim 3, wherein the first RF coil element and the second RF coil element are formed separately from each other on a base of the RF coil.

5. The MRI system of claim 4, wherein the first RF coil element and the second RF coil element are formed in a loop shape.

6. The MRI system of claim 4, wherein MR signals generated by the first RF coil element and the second RF coil element are decoupled from each other and acquired.

7. The MRI system of claim 3, wherein the first RF coil element and the second RF coil element are formed to overlap each other on a base of the RF coil.

8. The MRI system of claim 1, wherein the system controller further comprises a third system controller configured to acquire an MR image of an element different from the first element and the second element.

9. The MRI system of claim 1, further comprising a cylindrical gradient coil connected to both the first system controller and the second system controller.

10. An operating method of a magnetic resonance imaging (MRI) system, the operating method comprising:
    determining target elements for magnetic resonance (MR) images of an object to be acquired;
    determining whether to capture MR images of the determined target elements simultaneously or sequentially; and
    acquiring MR images of the target elements of the object by operating a system controller of the MRI system;
    wherein the target elements are two or more different elements, and the system controller is plural in number,
    wherein the plural of system controllers are different from each other,
    wherein the acquiring MR images of the target elements of the object comprises generating gradient magnetic fields in x-axis, y-axis, and z-axis directions perpendicular to each other by using surface gradient (G)-coils individually connected to a number of the plural system controllers,
    wherein the MRI system further comprises a first surface gradient (G)-coil and a second surface gradient (G)-coil, respectively, connected to a first system controller and a second system controller of the plural of system controllers,
    wherein the first system controller is configured to control the first surface gradient (G)-coil to generate a first gradient magnetic field for capturing a first MR image of a first element, and
    wherein the second system controller is configured to control the second surface gradient (G)-coil to generate a second gradient magnetic field for capturing a second MR image of a second element.

11. The operating method of claim 10, wherein the target elements are hydrogen ($^1$H), phosphorous ($^{31}$P), sodium ($^{23}$Na), and carbon isotopes ($^{13}$C).

12. The operating method of claim 10, wherein the magnetic resonance images of the target elements are simultaneously acquired by using a number of system controllers corresponding to the target elements.

13. The operating method of claim 10, the magnetic resonance images of the target elements are simultaneously or sequentially acquired by using at least one of the system controllers.

* * * * *